May 31, 1960 H. T. LYMAN 2,938,392

RADIO FREQUENCY TUNER WITH MECHANICAL TRACKING ARRANGEMENT

Filed Oct. 29, 1958 2 Sheets-Sheet 1

INVENTOR.
Harold T. Lyman
BY
Oomc, McDougall, Williams & Hersh
Attorneys

RADIO FREQUENCY TUNER WITH MECHANICAL TRACKING ARRANGEMENT

Filed Oct. 29, 1958 2 Sheets-Sheet 2

INVENTOR.
Harold T. Lyman
BY
Ooms, McDougall, Williams & Hersh
Attorneys

United States Patent Office 2,938,392

Patented May 31, 1960

2,938,392

RADIO FREQUENCY TUNER WITH MECHANICAL TRACKING ARRANGEMENT

Harold T. Lyman, Milford, Conn., assignor to Aladdin Industries, Incorporated, Nashville, Tenn., a corporation of Illinois Filed Oct. 29, 1958, Ser. No. 770,474

7 Claims. (Cl. 74—10.45)

This invention relates to tuners for radio and television frequencies, and pertains particularly to tuners of the type employing a plurality of variable tuning elements, each of which must be tracked as precisely as possible to a predetermined tuning curve in order that the tuner may operate with maximum efficiency.

One object of the present invention is to provide a radio frequency tuner having a plurality of movable tuning members which are operated simultaneously by a single movable control member, the tuner being provided with a tracking mechanism for effecting slight, adjustable tracking movements of the tuning members relative to the control member in the various positions thereof.

A further object is to provide a new and improved tuner of the foregoing character in which a plurality of bendable tracking cams are provided to bring about the tracking movement in response to the movement of the control member.

Another object is to provide such a new and improved tuner in which the tracking cams are secured to a shaft which is rotatably mounted on a control member and is adapted to be rotated in response to movement thereof.

A further object is to provide such a new and improved tuner wherein the tracking cams are arranged to effect slight tracking movement of the tracking elements, which are movably mounted on the control member.

Still another object is to provide a new and improved tuner of the foregoing character which is effective, dependable and easy to adjust, yet is low in cost.

Further objects and advantages of the present invention will become apparent from the following description, taken with the accompanying drawings, in which.

Figure 1:
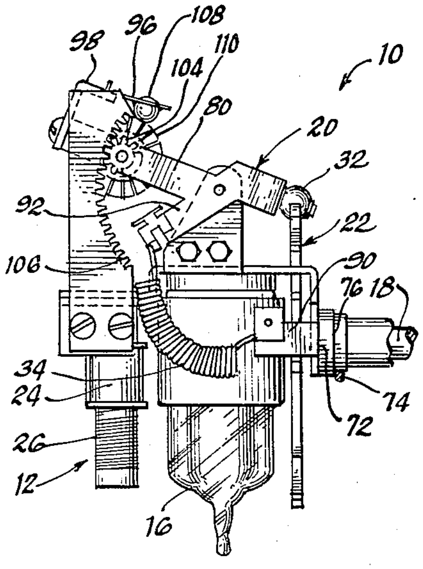
Fig. 1 is a side elevational view of a television tuner to be described as an illustrative embodiment of the present invention.

The invention is applicable to various types of tuners for radio frequencies, but it is shown as applied to a television tuner 10 adapted to cover the twelve very high frequency (VHF) television channels numbered 2–13.

The tuner 10 may be of the usual superheterodyne type, having a plurality of variable tuning elements 12. Although any suitable number of tuning elements may be employed, there are four such elements in the illustrated tuner. The tuner may be of the type having a radio frequency amplifier stage 14 and a superheterodyne converter stage 16. One of the variable tuning devices 12 may be employed to tune the input circuit of the radio frequency amplifier stage 14. Two of the tuning devices 12 may be employed in tuning the coupling circuit between the radio frequency amplifier stage 14 and the converter or mixer stage 16. A fourth tuning element may be utilized to tune the oscillator associated with the converter stage 16.

In this case, a single rotatable control shaft 18 is provided to operate all of the variable tuning devices 12 simultaneously. The movement of the shaft 18 is transmitted to the tuning devices 12 by a rocker 20 operable by a cam 22 on the shaft 18.

The present invention is applicable to any suitable or desired type of tuning elements. It will be of interest, however, to note that each of the illustrated tuning elements 12 has a movable tuning member 24 for adjusting the resonant frequency of the tuning device. In this case, each tuning member 24 comprises a sleeve which is movable linearly along a coil 26. A flexible rod 28 may be employed to connect each tuning member 24 to the swingable rocker 20.

A few additional details of the tuning elements 24 will be of interest, although they are not strictly essential to the present invention. Thus, each of the illustrated coils 26 is preferably coated with insulating material, or otherwise insulated from the slidable sleeve 24, so that the sleeve will be capacitively coupled to the underlying portion of the coil. The sleeve 24 constitutes an electrode made of metal or other conductive material, so as to function as one terminal of the tuning device. One end of the coil 26, in this case the upper end, provides the other terminal for the tuning device. Only the upper portion of the coil 26, between the upper end and the sleeve, is in the tuned circuit. Thus, the movement of the sleeve 24 along the coil varies the effective inductance thereof. The flexible operating rods 28 may be made of conductive material so as to provide electrical connections to the sleeves 24.

The illustrated rocker 20 is swingable about a pair of balls or other suitable pivots 30. It will be seen that a generally spherical roller 32 is rotatably mounted on the rocker and serves as a follower for engaging the cam 22. By means of springs 34 or other suitable means, the rocker 20 is biased in a direction to urge the follower 32 against the cam 22.

The illustrated cam 22 is in the form of a flat plate having a plurality of adjustable lobes 36, as disclosed and claimed in the co-pending application of Francis G. Mason, Serial No. 679,172, filed August 20, 1957. Some of the details of the cam 22 will be of interest, although not strictly essential to the present invention. Thus, the cam 22 has a plate-like body 38, from which the lobes 36 radiate, the illustrated lobes being integral with the body. In this case, there are thirteen of the lobes 36. Twelve of the lobes 36 cover the twelve VHF television channels, while the 13th lobe provides a UHF converter position, at which the input and the output of the radio frequency amplifier 14 are tuned to the intermediate frequency of the superheterodyne converter, so that the amplifier and mixer stages 14 and 16 will serve as extra intermediate frequency amplifier stages to receive the output of a separate converter for tuning the ultra high frequency television channels.

Each of the lobes 36 has a relatively wide, main or outer portion 40, and a relatively narrow neck or inner portion 42. In each case, the outer portion 40 is connected to the body 38 by the neck 42. It will be seen that the neck 42 is at one edge of the outer portion 40. By bending the neck 42, the effective radial height of the outer portion 40 may be varied. The bending of the lobe 36 is facilitated by forming a slot 44 in the outer portion 40 to receive a screw driver or other suitable wool.

In the case of most of the lobes 36, an outwardly facing detent notch 46 is formed in the outer portion 40, for receiving the follower roller 32. In this way, the cam 22 is self detenting. In certain cases, the detenting action is provided by slots 48 between the lobes, rather than notches therein.

It has already been noted that the cam 22 is mounted on the main control shaft 18. It will be seen that the shaft 18 is rotatably supported by means of front and rear bearings 50 and 52. In order to provide a fine tuning adjustment, the bearings 50 and 52 are arranged so that the shaft 18 may be moved vertically to a slight extent. This in turn causes movement of the cam 22, the rocker 20 and the movable tuning sleeves 24. The fine tuning mechanism may be of the type disclosed and claimed in the co-pending application of Louis E. Coutermash and Francis G. Mason, Serial No. 499,269, filed April 5, 1955, now Patent No. 2,872,824. Although not strictly essential to the present invention, certain details of the fine tuning mechanism will be of interest.

The illustrated arrangement is such that the shaft 18 may not only be rotated, but also may be pivoted about the rear bearing 52. Thus, the bearing 52 comprises a ball 54 adapted to be received in an axial recess 56 formed in the rear end of the shaft 18. The recess 56 is conically shaped so that the ball will be centered with respect to the shaft. To the rear of the shaft 18, the ball is seated in an opening 58 formed in a stationary frame member 60.

Figure 2:
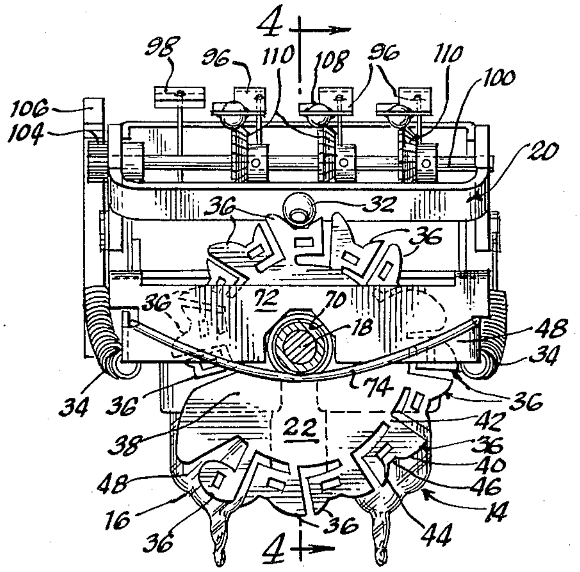
Fig. 2 is a front elevational view of the tuner of Fig. 1.
Figure 3:
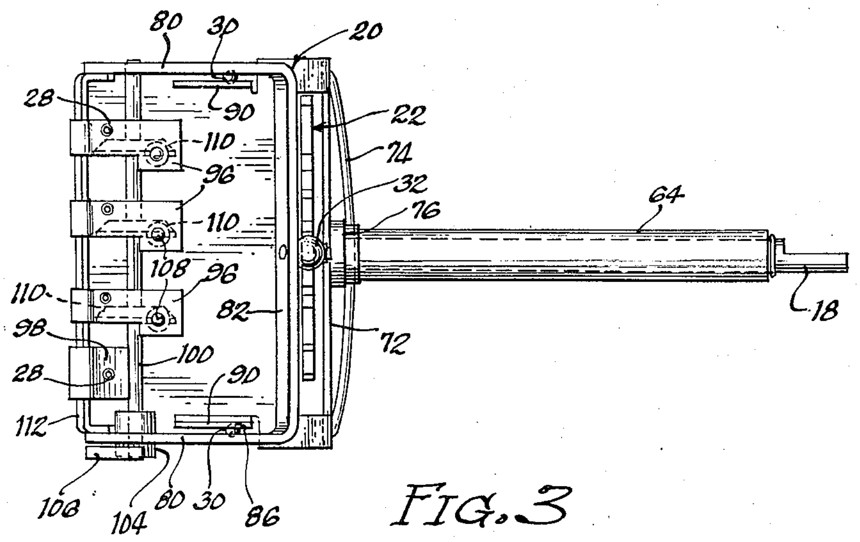
Fig. 3 is a top view of the tuner.
Figure 4:
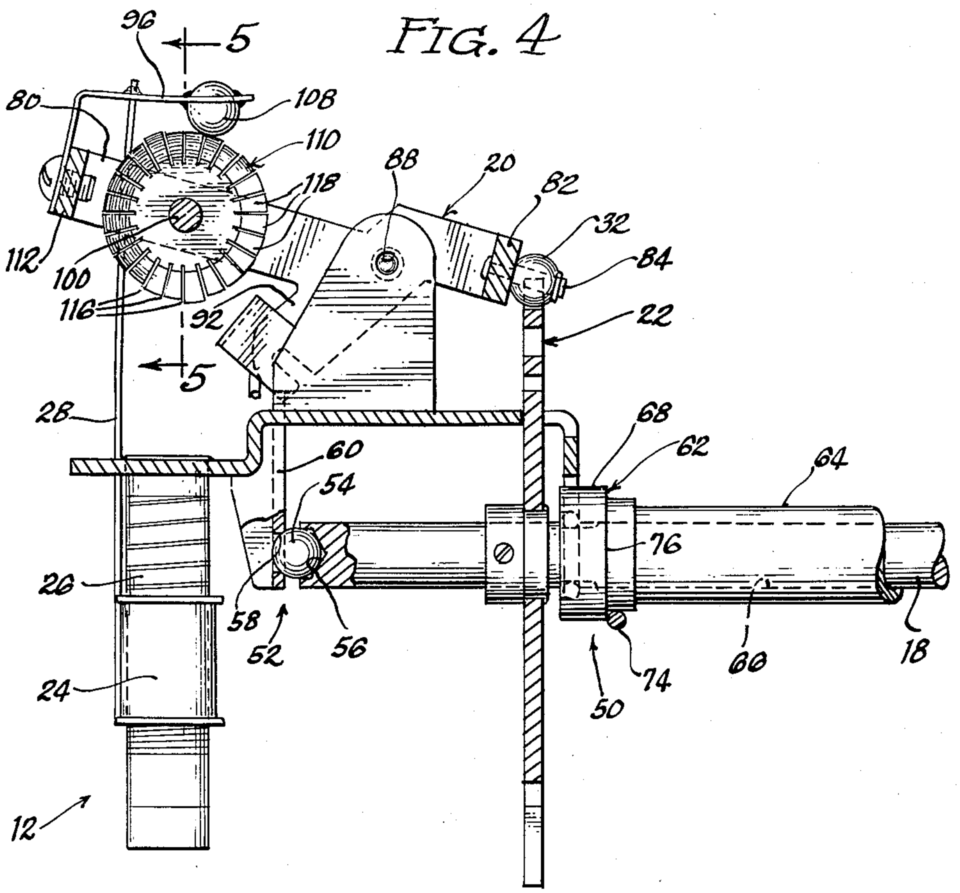
Fig. 4 is an enlarged elevational section, taken generally along the line 4—4 in Fig. 2.
Figure 5:
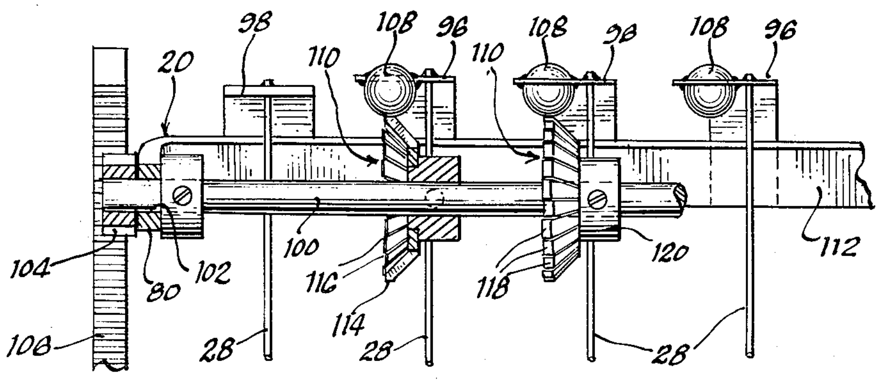
Fig. 5 is a fragmentary sectional view, taken generally along the line 5—5 in Fig. 4.

The illustrated front bearing 50 comprises a rotatable sleeve or bushing 62 which is received over the shaft 18. A hollow tubular shaft 64 extends forwardly from the bushing 62 along the shaft 18, so that the bushing 62 may be manually rotated. A bore 66 extends through the bushing 62 and the hollow shaft 64 to receive the main control shaft 18. The bushing 62 has an outer cylindrical surface 68 which is slightly eccentric with respect to the bore 66. As shown to advantage in Fig. 2 the cylindrical outer surface 68 of the bushing is seated in a tapered notch 70 which is formed in a stationary frame member 72. A wire bowspring 74 presses the bushing 62 into the notch 70. It will be seen that the spring 74 also presses rearwardly against a shoulder 76 of the bushing 62, so as to urge the shaft 18 rearwardly against the ball 54.

When the hollow shaft 64 is rotated, the eccentricity of the bushing 68 causes the shaft 18 to swing about the ball 54 in a small orbit. The resulting movement of the cam 22 causes the rocker 20 to be swung to a slight extent, so that the tuning sleeves will be moved slightly.

While the rocker 20 may be varied in construction, it is shown as a one-piece, generally U shaped member having parallel arms 80 extending rearwardly from a cross bar 82. The follower roller 32 is rotatably mounted on a pin or shaft 84 which is secured to the cross bar 82 and extends forwardly therefrom. The pivot balls 30 are engaged with suitable recesses 86 in the arms 80, and are seated in openings 88 formed in stationary members 90.

The springs 34 are connected between stationary frame members 90 and short, downwardly branching arms 92 on the rocker 20. As shown, each spring 34 is of the coiled, extensible type, and is flexed into an arcuate position in its position of use. However, in its free or original state, each spring 34 has a straight axis. The resilient tendency of the springs 34 to straighten out is utilized to bias the rocker 20 clockwise (Fig. 1) so as to hold follower roller 32 against the cam 22. The ends of the springs are pivotally connected to the members 90 and the arms 92. This spring arrangement has the advantage of providing nearly constant biasing force on the rocker 20 throughout its range of movement. Thus, the manual effort needed to rotate the main control shaft 18 is maintained substantially constant for all of its various positions.

It has already been indicated that flexible rods 28 are connected between the rocker 20 and the tuning sleeves 24, so as to slide the sleeves along the coil 26 in response to swinging movement of the rocker 20. To provide for slight tracking movement of the sleeves 24, three of the four flexible rods 28 are connected to tracking arms 96 which are movably mounted on the rocker 20. The fourth rod 28 is connected to an arm or bracket 98 which is rigidly secured to the rocker 20. In the typical case, the bracket 98 is connected to the rod 28 for the tuning device 12 which controls the oscillator of the superheterodyne tuner. The tracking arms 96 are connected to the tuning device 12 for the input and output circuits of the radio frequency amplifier stage 14. The adjustability of the cam 22 is utilized to track the oscillator to the desired tuning curve. Thus, the movement of the entire rocker 20 is tracked to the desired curve by adjusting the lobes 36 of the cam 22. The radio frequency tuning circuits are tracked by providing additional tracking means to move the tracking arms 96 to a slight extent with respect to the rocker 20.

In this case, the additional tracking means comprise a tracking shaft 100 which extends between the rear portions of the arms 92 and is rotatably journaled in openings 102 formed therein. Means are provided to rotate the tracking shaft 100 in response to the swinging movement of the rocker 20. As shown, a gear or pinion 104 is secured to one end of the shaft 100. The gear 104 meshes with a stationary gear 106 which is positioned with its axis coinciding with the pivotal axis of the rocker 20. As shown, the stationary gear 106 takes the form of an arcuate internal gear rack, centered about the axis of the pivot balls 30.

The tracking arms 96 are provided with followers 108 adapted to engage adjustable tracking cams 110 which are secured to the tracking shaft 100. In this case each follower 108 takes the form of a ball mounted on the tracking arm 96. Each arm 96 is provided with resilient means for holding the follower 108 against the corresponding cam 110. In this case, each arm 96 takes the form of a thin, flexible, resilient leaf spring which is bent so as to be generally L-shaped. The lower end of each arm 96 is secured to a bar 112 which is rigidly connected to the rear ends of the rocker arms 80. Each arm 96 extends upwardly from the bar 112, and then forwardly over the corresponding cam 110. The inherent resilience of the arm 96 biases the follower 108 against the cam 110.

It will be seen that each tracking cam 110 has a thin, bendable outer portion 114 which is engaged by the corresponding follower 108. In this case, the bendable portion 114 is generally frustoconical in shape. A large number of angularly spaced slots 116 are formed in each cam 110, so as to divide the bendable portion 114 into a series of individually bendable tabs 118. The slots and tabs 116 and 118 radiate from a hub portion 120 which is secured to the tracking shaft 100.

For each position of the main tuning cam 22, the tracking follower 108 will engage a different tab 118 on each tracking cam 110. The tab 118 may be bent slightly to cause slight tracking movement of the follower 108. This in turn will move the tracking arm 96 relative to the rocker 20, and will cause slight tracking movement of the tuning sleeve 24. By adjusting the tabs 118 of the tracking cams 110, all of the tuning elements 12 may be made to follow predetermined tuning curves with a high degree of precision. Thus, the tuner will operate at maximum efficiency for every position of the main tuning shaft 18.

It will be recognized that the mechanical tracking arrangement is dependable and easy to adjust. Moreover, it provides a precise tracking adjustment for every tuning element at every position of the main tuning shaft. Nevertheless, the tracking arrangement is easy to manufacture and low in cost.

Various modifications, alternative constructions and equivalents may be employed without departing from the true spirit and scope of the invention, as exemplified in the foregoing description and defined in the following claims.

I claim:

1. In a tuner for radio frequencies, the combination comprising a plurality of variable tuning elements, each of said elements having a slidable member for varying the resonant frequency thereof, a swingable rocker for moving said members, a rotatable tuning cam for swinging said rocker, said rocker having a follower thereon engageable with said cam, resilient means biasing said rocker in a direction to maintain said follower against said cam, a plurality of spring arms on said rocker, flexible rods extending between said spring arms and said slidable members of said tuning elements for moving said slidable members in response to swinging movement of said rocker, a shaft rotatably mounted on said rocker, a plurality of tracking cams secured to said shaft, each of said spring arms having a follower thereon engageable with one of said tracking cams, each of said tracking cams having a plurality of angularly spaced slots therein dividing said tracking cam into a plurality of bendable tabs for adjusting the height of said tracking cam in various rotary positions thereof, a gear secured to said shaft, and a stationary arcuate gear rack meshing with said gear for rotating said shaft in response to swinging movement of said rocker, said tabs of said tracking cams being adjustably bendable to effect slight tracking movement of said spring arms relative to said rocker in various angular positions thereof.

2. In a radio frequency tuner, the combination comprising a rotatable control shaft, a main tuning cam secured to said shaft, a swingable rocker having a follower thereon engageable with said cam, means for biasing said rocker in a direction to urge said follower against said cam, rotation of said control shaft being effective to swing said rocker to a succession of angular positions, a tracking shaft rotatably mounted on said rocker, a gear secured to said tracking shaft, stationary gear means meshing with said gear for rotating said tracking shaft in response to swinging movement of said rocker, a plurality of tracking cams secured to said tracking shaft, a plurality of tracking arms movably mounted on said rocker, said arms having followers thereon engaging said respective tracking cams, each of said tracking arms having means biasing the corresponding follower against the corresponding tracking cam, a plurality of variable tuning elements having respective movable members for varying the resonant frequency thereof, and means connecting said movable members to said tracking arms for movement in response to swinging movement of said rocker, each of said tracking cams having a plurality of slots therein dividing said tracking cam into a plurality of tabs movable against said follower on the corresponding tracking arm in the successive angular positions of said rocker, said tabs being bendable to adjust the height of said tracking cams in the various positions thereof so as to effect slight tracking movement of said tracking arms relative to said rocker.

3. In a radio frequency tuner, the combination comprising a movable control member, a tracking shaft rotatably mounted on said control member for rotation relative thereto, mechanism for rotating said shaft relative to said control member in response to movement of said control member, a plurality of tracking cams secured to said tracking shaft, a plurality of tracking elements engaging said cams and movably mounted on said control member for movement relative thereto, and a plurality of variable tuning elements having movable tuning members connected to said tracking elements for movement in response to movement of said control member, each of said tracking cams having a bendable portion for adjusting the height of said cam in the various positions thereof, and thereby effecting slight tracking movement of said tracking elements relative to said control member.

4. In a radio frequency tuner, the combination comprising a rotatable control shaft, a main tuning cam secured to said shaft, a swingable rocker having a follower thereon engageable with said cam, means for biasing said rocker in a direction to urge said follower against said cam, rotation of said control shaft being effective to swing said rocker to a succession of angular positions, said cam being locally bendable to adjust the position of said rocker in various positions of said shaft, a tracking shaft rotatably mounted on said rocker for rotation relative thereto, a mechanism for rotating said tracking shaft relative to said rocker in response to swinging movement of said rocker, a plurality of tracking cams secured to said tracking shaft, a plurality of tracking arms movably mounted on said rocker for movement relative thereto, said arms having followers thereon engaging said respective tracking cams, a plurality of variable tuning elements having respective movable tuning members for varying the resonant frequency thereof, and means connecting said movable members to said tracking arms for movement in response to swinging movement of said rocker, each of said tracking cams being locally bendable to adjust the positions of said movable tuning members in various positions of said rocker.

5. In a radio frequency tuner, the combination comprising a rotatable control shaft, a main tuning cam secured to said shaft, a swingable rocker having a follower thereon engageable with said cam, means for biasing said rocker in a direction to urge said follower against said cam, rotation of said control shaft being effective to swing said rocker to a succession of angular positions, a tracking shaft rotatably mounted on said rocker for rotation relative thereto, a mechanism for rotating said tracking shaft relative to said rocker in response to swinging movement of said rocker, a plurality of tracking cams secured to said tracking shaft, a plurality of tracking arms movably mounted on said rocker for movement relative thereto, said arms having followers thereon engaging said respective tracking cams, a plurality of variable tuning elements having respective movable tuning members for varying the resonant frequency thereof, and means connecting said movable members to said tracking arms for movement in response to swinging movement of said rocker, each of said tracking cams being locally bendable to adjust the positions of said movable tuning members in various positions of said rocker.

6. In a radio frequency tuner, the combination comprising a movable control member, a tracking member movably mounted on said control member for movement relative thereto, a mechanism for moving said tracking member relative to said control member in response to movement of said control member, a plurality of tracking cams secured to said tracking member, a plurality of tracking followers engaging said cams and movably mounted on said control member for movement relative thereto, and a plurality of variable tuning elements having movable tuning members connected to said tracking followers for movement in response to movement of said control member, each of said tracking cams having a bendable portion for adjusting the positions of said tuning members in various positions of said movable member.

7. In a radio frequency tuner, the combination comprising a rotatable control shaft, a main tuning cam secured to said shaft, a swingable rocker having a follower thereon engageable with said cam, means for biasing said rocker in a direction to urge said follower against said cam, rotation of said control shaft being effective to swing said rocker to a succession of angular positions, said cam having a plurality of angularly spaced individually bendable lobes engageable with said follower to adjust the position of said rocker in various positions of said cam, a tracking shaft rotatably mounted on said rocker, a gear secured to said tracking shaft, stationary gear means meshing with said gear for rotating said tracking shaft in response to swinging movement of said rocker, a plurality of tracking cams secured to said tracking shaft, a plurality of tracking arms movably mounted on said rocker, said arms having followers thereon engaging said respective tracking cams, each of said tracking arms having means biasing the corresponding follower against the corresponding tracking cam, a plurality of variable tuning elements having respective movable members for varying the resonant frequency thereof, and means connecting said movable members to said tracking arms for movement in response to swinging movement of said rocker, each of said tracking cams having a plurality of slots therein dividing said tracking cam into a plurality of tabs movable against said follower on the corresponding tracking arm in the successive angular positions of said rocker, said tabs being bendable to adjust the height of said tracking cams in the various positions thereof so as to effect slight tracking movement of said tracking arms relative to said rocker.

References Cited in the file of this patent

UNITED STATES PATENTS

| | | |
|---|---|---|
| 2,379,284 | Dimmer | June 29, 1945 |
| 2,534,768 | Hall | Dec. 19, 1950 |
| 2,572,964 | Wulfsberg | Oct. 30, 1951 |
| 2,872,824 | Coutermash | Feb. 10, 1959 |

FOREIGN PATENTS

| | | |
|---|---|---|
| 546,882 | Canada | Oct. 1, 1957 |